(12) United States Patent
Riedel et al.

(10) Patent No.: US 6,817,369 B1
(45) Date of Patent: Nov. 16, 2004

(54) DEVICE AND METHOD FOR CLEANING SUBSTRATES

(76) Inventors: Thomas Riedel, Karlstrasse 17, D-72138 Kirchentellinsfurt (DE); Klaus Wolke, Reuteweg 3, D-75382 Althengstett (DE)

( * ) Notice: Subject to any disclaimer, the term of this patent is extended or adjusted under 35 U.S.C. 154(b) by 189 days.

(21) Appl. No.: 10/111,332

(22) PCT Filed: Oct. 17, 2000

(86) PCT No.: PCT/EP00/10212
§ 371 (c)(1),
(2), (4) Date: Apr. 18, 2002

(87) PCT Pub. No.: WO01/29883
PCT Pub. Date: Apr. 26, 2001

(30) Foreign Application Priority Data

Oct. 19, 1999 (DE) .......................................... 199 50 365
Feb. 18, 2000 (DE) .......................................... 100 07 439

(51) Int. Cl.$^7$ ................................................ B08B 3/00
(52) U.S. Cl. .................. 134/98.1; 134/56 R; 134/94.1; 134/96.1; 134/95.3; 134/99.1; 134/105; 134/107; 134/902; 156/345.15; 156/345.17

(56) References Cited

U.S. PATENT DOCUMENTS

| 4,749,440 A | 6/1988 | Blackwood et al. |
| 5,503,708 A | 4/1996 | Koizumi et al. |
| 5,783,495 A | 7/1998 | Li et al. |
| 5,954,878 A | 9/1999 | Mandal et al. |

FOREIGN PATENT DOCUMENTS

| DE | 19704454 | 8/1998 |
| EP | 0867924 | 9/1998 |
| JP | 05 259139 | 10/1993 |

OTHER PUBLICATIONS

JP 5–226315, dated Sep. 03, 1993.

Primary Examiner—M. Kornakov
(74) Attorney, Agent, or Firm—Robert W. Becker & Associates; Robert W. Becker

(57) ABSTRACT

The inventive device for cleaning substrates, especially semiconductor wafers, comprises a treatment basin for receiving at least one substrate, a cover for sealing said treatment basin, a first feeding device for controllably feeding in a reactive gas, a second feeding device for controllably feeding in at least one moist fluid for promoting a reaction between the reactive gas and a deposit to be removed from the substrate and a control device for controlling the concentration of moisture in the treatment basin.

19 Claims, 5 Drawing Sheets

DEVICE AND METHOD FOR CLEANING SUBSTRATES

BACKGROUND OF THE INVENTION

The present invention relates to an apparatus and to a method for the cleaning of substrates, especially semiconductor wafers.

Various methods and apparatus are known for the cleaning of semiconductor wafers. With one of these methods for the removal of organic contaminations, such as photo lacquer, the wafers are treated in a conventional wet cleaning process with sulfur peroxide mixtures (SPM) in order to remove the organic molecules. However, due to the chemicals that are used, this process is very cost intensive and furthermore has environmental problems during the removal of the used chemicals.

With a further method, which has a dry-cleaning process, gases containing $O_2$ or $H_2$ are used in order to remove fluorocarbon polymers from semiconductor wafers. Although no problems occur herewith due to the components that are used, such dry-cleaning processes are very time intensive, which leads to high costs.

A method is known from EP-A-0 867 924 according to which ozone gas is introduced into a steam or water vapor atmosphere that contains an additive in order to remove organic contaminations from a semiconductor wafer. In so doing, ozone is used to oxidize the contamination, and the steam promotes the oxidation process. With this method, the steam atmosphere is generated by heating and partially evaporating a water layer located below a wafer. The steam atmosphere is saturated at its operating temperature, which is greater than the temperature of the wafers. This causes a condensation of the steam upon the wafers, and a water layer forms upon the upper surface of the wafers. This water layer reaches a thickness that considerably disrupts an oxidation of the contaminations, since not only the ozone, but also OH radicals generated by interaction with the water, or other reactive components, do not come into contact with the contaminations. This is in particular the case if the thickness of the water layer is greater than the lifetime of the reactive components, such as ozone, times its diffusion constant in water.

SUMMARY OF THE INVENTION

Proceeding from the above mentioned method, it is an object of the present invention to provide an apparatus and a method that enables a rapid and effective cleaning of substrates in a simple and economical manner.

Pursuant to the present invention, this object is realized by an apparatus for the cleaning of substrates, especially semiconductor wafers, having a treatment tank for the accommodation of at least one substrate, a cover for the closing off of the treatment tank, a first introduction device for the controllable introduction of a reactive gas, a second introduction device for the controllable introduction of a moisture-containing fluid that promotes a reaction between the reactive gas and a contamination that is to be removed from the substrate, and a control device for the controlling of the moisture concentration in the treatment tank. The apparatus provides a closed system and enables a precise control of the concentration of moisture in the treatment tank. The moisture concentration can be adapted to the respective cleaning process, as a result of which the formation of a liquid layer on the substrates that are to be cleaned by the moisture-containing fluid can be prevented in a controlled manner or entirely. This is important in order to ensure that the reactive gas, or other reactive components, come into contact with the contaminations or impurities. Furthermore, the ratio of the reactive gas to the fluid can be set in order to provide an optimum cleaning atmosphere and to reduce the consumption of media. The closed system furthermore prevents an uncontrolled escape of the reactive gas/fluid mixture.

Pursuant to one preferred embodiment of the invention, the first introduction device has a valve for the control of the introduced quantity of gas, in order in this way to provide a controlled process atmosphere. The first introduction device preferably has an ozone generator, since ozone is particularly suitable and economical for the oxidation and removal of organic contamination.

In order to be able to control the concentration of moisture in the treatment tank in a simple manner, the second introduction device preferably has at least one valve for the control of the introduced quantity of fluid. The second introduction device preferably has a vapor generator, especially a water vapor, i.e. steam generator, since steam is easy to produce and can be used as a reaction-promoting fluid. In this connection, the moisture concentration and/or temperature of the vapor is preferably controllable.

Pursuant to a particularly preferred embodiment of the invention, the second introduction device has at least one liquid inlet nozzle. Since a specific quantity of a liquid is introduced into the treatment tank, the moisture concentration can be established in a simple manner. In this connection, the liquid inlet nozzle is preferably disposed above the substrates and is directed onto them in order to enable a rinsing of the substrates. In particular, the oxidized reaction products are rinsed off of the wafers in order to expose the non-oxidized layers disposed there below.

For the control of the process atmosphere, in particular also the concentration of moisture in the treatment tank, the apparatus preferably has a heating device for the heating of the treatment tank and/or of the tank contents, a controllable withdrawal device, and/or a controllable liquid outlet.

To further enhance the reaction of the reactive gas, or to optimize the process conditions, the apparatus has a third introduction device for the controllable introduction of a further fluid, especially a wetting agent.

To permit the controlled displacement of the process components out of the treatment tank, and thus prevent their escape into the atmosphere when the tank is opened, a further gas introduction device is preferably provided for the controllable introduction of a further gas, especially an inert gas.

For a precise setting of the moisture concentration, a device is provided for the measurement of the concentration of moisture in the treatment tank. This enables a feedback of the actual moisture concentration to the control device, which in conformity therewith can adapt its control parameters.

Pursuant to a particularly preferred embodiment of the invention, the treatment tank is pressure tight and the apparatus has a pressure control device that is suitable for controlling the pressure in the treatment tank to an overpressure. By using an overpressure in the treatment tank it is possible to use steam or vapor having a greater temperature, which promotes a reaction and thus accelerates the progress of the process. Furthermore, by means of the pressure it is possible to control the concentration of moisture in the treatment tank, as well as to control the boundary layer or interface between substrate surface and process atmosphere. By the use of overpressure, there thus results a good controllability of the moisture concentration as well as a shortened process time, as a result of which the throughput of the apparatus is increased. In this connection, the treatment tank is preferably sealed in a pressure tight manner by the cover in order to achieve a good seal relative to the surrounding atmosphere. The danger that ozone escapes from the treatment tank is prevented, as a result of which the use of greatly concentrated ozone is possible without a danger to the environment. The use of greatly concentrated ozone leads to an increased reaction rate, as a result of which the process times can be reduced still further.

The object of the invention is also realized by a method for the cleaning of substrates, especially semiconductor wafers, in a treatment tank for the accommodation of at least one substrate, with the following method steps:

Introducing a substrate into the tank; closing off the treatment tank; introducing a reactive gas and at least one moisture-containing fluid that promotes a reaction between the reactive gas and a contamination that is to be removed from the substrate; and controlling the concentration of moisture in the treatment tank. As a result of this method, the advantages already mentioned above in conjunction with the apparatus are achieved.

To achieve a control process atmosphere, the quantity of the introduced reactive gas and/or of the fluid are preferably controlled.

Pursuant to one embodiment of the invention, a fluid is vapor, especially steam, the moisture and/or temperature of which is controlled. To avoid the formation of a liquid layer upon the substrate, and the drawbacks connected therewith, the process atmosphere in the treatment tank is preferably controlled in such a way that essentially no condensation of the vapor upon the substrate occurs. Pursuant to one embodiment of the invention, for this purpose the temperature of the substrate is held at or above the temperature of the vapor. The vapor is preferably introduced into the treatment prior to the reactive gas, especially ozone.

To maintain constant process conditions, and to enable the supply of unused media, at least a portion of the mixture of reactive gas and fluid found in the treatment tank is drawn out. For this purpose, the quantity of the withdrawn mixture is preferably controlled.

In order in addition to the maintenance of a moist process atmosphere to enable a rinsing of the substrates and a good mass transfer, a fluid is preferably a liquid. Advantageously at least a portion of the liquid is withdrawn in order to maintain uniform and controlled process conditions. In this connection, the quantity of the withdrawn liquid is preferably controlled. For a good rinsing, the liquid is preferably sprayed onto the substrate from above. This process is preferably effected during short time intervals in order to prevent the uncontrolled formation of a liquid layer upon the substrate. In this connection, the time intervals for the spraying are preferably considerably shorter than the intervals there between.

For a good control of the process atmosphere, the temperature of the treatment tank and/or the tank contents are preferably controlled. The moisture content is preferably controlled with the aid of the quantity of the introduced reactive gas, the quantity of the introduced fluid and/or the temperature. Pursuant to one embodiment of the invention, the concentration of moisture in the treatment tank is measured and is regulated with the aid of the measurement results.

To prevent an escape of the reactive mixture of gas and fluid when the treatment tank is opened, the reactive mixture is withdrawn after the cleaning. Pursuant to one embodiment of the invention, after the cleaning a further gas, especially an inert gas, that displaces the reactive gas is introduced into the treatment tank. Pursuant to a further embodiment, after the cleaning a treatment liquid is introduced into the treatment tank in order to further treat the substrate. Since the treatment liquid is introduced directly into the treatment tank, a handling and a transport of the substrates into a further treatment unit is eliminated, thereby eliminating the danger of damage to the substrates during the handling and/or the transport.

The inventive apparatus and the inventive method are particularly suitable for the removal of organic contaminations, such as photo lacquer, from semiconductor wafers.

Pursuant to a particularly preferred embodiment of the invention, the pressure in the treatment tank is controlled, in particular is controlled to an overpressure, as a result of which high vapor temperatures can be achieved during the treatment.

Furthermore, by means of the pressure a control of the concentration of moisture in the treatment tank is possible.

BRIEF DESCRIPTION OF THE DRAWINGS

The invention will be subsequently explained in greater detail with the aid of preferred exemplary embodiments with reference to the figures; shown are.

DESCRIPTION OF PREFERRED EMBODIMENTS

Figure 1:
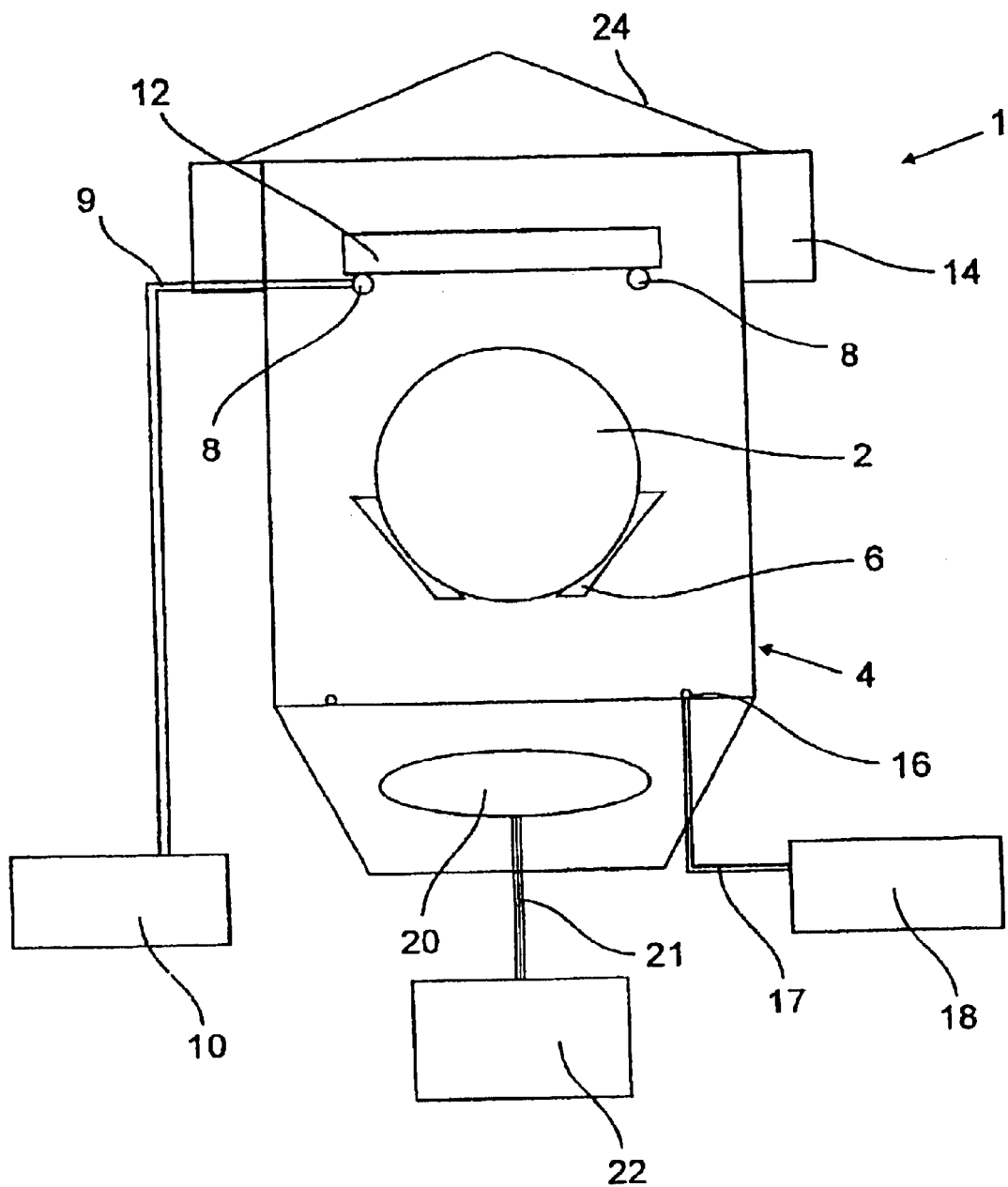
FIG. 1 a schematic illustration of a first exemplary embodiment of the invention.

FIG. 1 shows an apparatus for the cleaning of semiconductor wafers 2 with a treatment tank 4. Disposed in the treatment tank 4 is a substrate receiving device 6 for holding the substrates 2 in an upright position. A plurality of substrates can be received in the treatment tank 4, with only one substrate being shown in FIG. 1. The treatment tank 4 has an upper portion, which has a square or rectangular cross-sectional configuration, and a lower portion, which tapers conically downwardly. In the upper region of the rectangular portion, the treatment tank 4 is provided with a diffuser 8 for the introduction of steam into the treatment tank 4. The diffuser 8 is connected with a steam generator 10 via an appropriate line 9. The diffuser 8 forms a ring, which is adapted to the shape of the treatment tank and enables a uniform distribution of steam in the tank. In so doing, the diffuser 8 forms an inner diameter that is sufficient to permit the substrates 2 to move through.

Provided above the diffuser 8 is a rinsing device, which is not illustrated in FIG. 1 and via which a rinsing liquid, in the form of a finely distributed mist, is introduced into the treatment tank 4. The rinsing liquid is introduced in such a way that the substrates that are accommodated in the treatment tank 4 are uniformly rinsed. Provided in a rim region of the treatment tank 4 is a heating device 12 for heating up the treatment tank 4 as well as the substrates 2. The heating device 12 is arranged in such a way that it does not obstruct a movement of the substrates 2 into and out of the treatment tank 4. The treatment tank 4 has an overflow 14 at its upper end.

Provided in the treatment tank 4, in a region below the substrate receiving device 6, is a diffuser 16 for the introduction of ozone. The diffuser 16 is connected with an ozone generator 18 via a line 17. The diffuser 16 is again an annular diffuser that is adapted to the shape of the treatment tank 4 and permits a uniform distribution of ozone in the tank 4. The diffuser is disposed in the lower region of the rectangular portion of the tank 4. Disposed in the conically tapering lower portion of the treatment tank 4 is an inlet/outlet opening 20 for rinsing liquid. The opening 20 is connected via a line 21 with a rinsing liquid source 22.

A cover 24 for sealing off the treatment tank 4 is provided above the treatment tank 4. The cover 24 is in a position, in a completely closed position, to seal off the treatment tank 4 relative to the environment in order to prevent the process components that are disposed therein from escaping. In the completely closed position, the connection of the treatment tank 4 to the overflow 14 is also closed off.

Although this is not separately illustrated, a withdrawal device for the controlled withdrawing of the process components from the treatment tank 4 is provided. The withdrawal device can selectively be mounted on the treatment tank 4 or on the cover 24.

During the operation of the apparatus 1, with the cover 24 opened, dry wafers 2, for example coated with photo lacquer or contaminated, are placed into the treatment tank 4 and are accommodated in the wafer receiver 6. Subsequently, the cover 24 is brought into a position that seals off the treatment tank 4. The interior of the treatment tank 4, and the substrates 2, are heated up by means of the heating device 12. Steam having a specified moisture content and temperature is generated in the steam generator 10. A gaseous substance, such as nitrogen, and/or a liquid medium, such as acetic acid, can selectively be mixed with the steam in order to enhance the subsequent cleaning process of the wafers 2. The thus produced steam is introduced into the treatment tank 4 in a controlled manner via the line 9 and the diffuser 8, i.e. a specific quantity of steam is introduced as a function of the volume of the tank in order to achieve a specific moisture concentration in the tank 4. The interior of the treatment tank 4, and the wafers 2, are heated to a temperature above the temperature of the steam in order to essentially prevent condensation of the steam onto the wafer.

Ozone is produced in the ozone generator 18 and is introduced into the treatment tank 4 in a controlled manner via the line 17 and the diffuser 16, i.e. the quantity of ozone is controlled as a function of the introduced quantity of steam. By means of the controlled introduction of the steam and the ozone gas, a stoichiometric ozone gas/steam mixture is produced, and the moisture concentration of the mixture is controlled. The ozone gas reacts with the photo lacquer that is to be removed, whereby the steam promotes and accelerates this reaction. The ozone oxidizes the photo lacquer and thereby enables a dislodging from the wafer 2.

During the treatment of the wafers, the withdrawal device can be activated in order to draw off a specified quantity of the ozone gas/steam mixture in order to enable the supply of fresh ozone and steam. By means of the controlled activation of the withdrawal device, it is also possible to control the moisture concentration in the treatment tank in that a certain quantity of the moist process atmosphere is drawn off. In so doing, the withdrawal device is operated in such a way that within the treatment tank, during the cleaning of the substrates, a slight overpressure results, i.e. less of the mixture is drawn off than was previously introduced.

During the above process, during certain time intervals the non-illustrated rinsing device is also activated in order to provide an interim rinsing of the substrates, and in particular especially to rinse the oxidized reaction products from the wafers. This ensures that the oxidized reaction products form no reaction barriers on the substrates, and that the ozone gas/steam mixture comes into contact with the non-oxidized layers disposed therebelow. During the rinsing of the substrates, a certain quantity of rinsing liquid is introduced into the treatment tank 4. This liquid has an influence upon the moisture concentration within the treatment tank, and is therefore included in the control of the moisture concentration. For the controlling of the moisture concentration in the treatment tank, a controlled quantity of the rinsing liquid that collects at the bottom of the treatment tank is preferably withdrawn via the inlet/outlet opening 20 after the rinsing process.

As already mentioned above, the rinsing processes are effected in short time intervals during the cleaning process. These time intervals are considerably shorter than the intervals between them since during the rinsing processes a precise control of a liquid layer thickness on the substrate surface is not possible or is possible only with difficulty. Therefore, liquid layer thicknesses can rapidly form on the substrates, which prevents the cleaning process.

During the overall process, the temperature of the tank and the contents is controlled by the heating device 12 in order to control the process atmosphere, in particular the moisture concentration, in the tank.

After a certain process time, which is a function of the quantity of the contamination that is to be removed, as well as of the composition thereof, the ozone gas/steam mixture is withdrawn from the treatment tank 4 via the withdrawal device. Alternatively, or in addition thereto, the treatment tank 4 is flooded with inert gas, for example nitrogen, via a further non-illustrated diffuser, in order to completely displace the ozone gas/steam mixture out of the treatment tank 4. Instead of an additional diffuser, the nitrogen could also be introduced via the ozone gas diffuser 16, whereby the diffuser 16 would then have to be connected to a nitrogen source.

After the ozone gas/steam mixture is completely removed from the treatment tank 4, the cover 24 is raised and a rinsing liquid, such as deionized water, is introduced from below into the treatment tank 4 via the inlet 20 in order to carry out a final rinsing and to terminate the cleaning process. The water flows into the overflow 14 and is withdrawn therefrom.

Finally, the water is withdrawn and the wafers are dried, whereby the drying can be effected during the withdrawal of the water pursuant to the Marangoni effect, whereby, for example, a fluid that reduces the surface tension of the water is applied to the water surface during withdrawal of the water.

Instead of displacing the ozone/gas steam mixture out of the treatment tank by introducing an inert gas, as described above, it is also possible to displace the ozone gas/steam mixture out of the treatment tank 4 by introduction of the deionized water or another liquid. If the ozone gas/steam mixture is displaced, for example, by deionized water for the rinsing of the wafers, in this case initially the cover 24 is not raised, since otherwise the ozone gas/steam mixture would escape into the atmosphere. The cover 24 is raised only when the ozone gas/steam mixture is completely displaced by the deionized water. The water is subsequently again withdrawn, and the wafers are dried.

Figure 2:
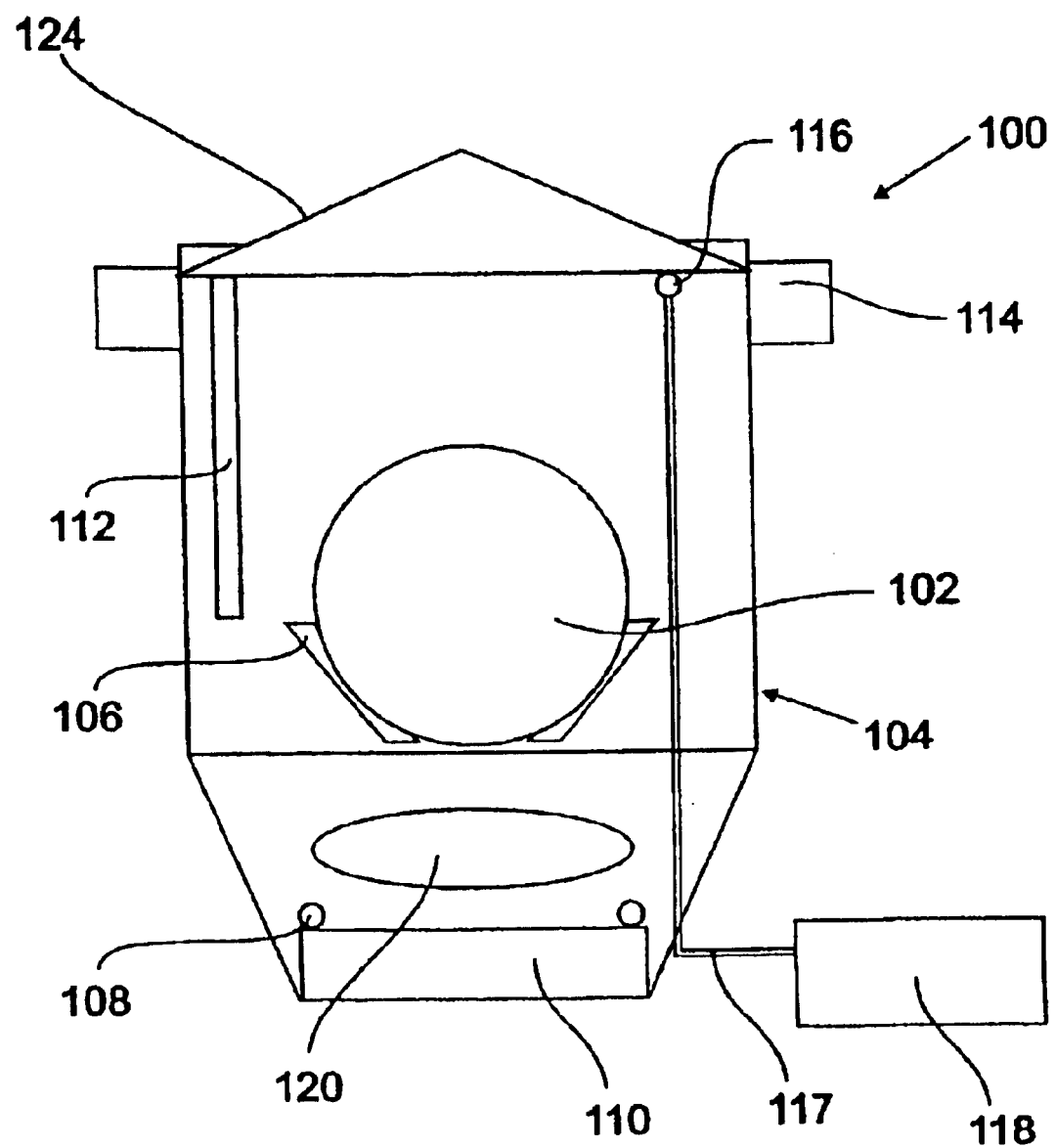
FIG. 2 a schematic illustration of a second exemplary embodiment of the invention.

FIG. 2 shows an alternative embodiment of a cleaning apparatus 100 for semiconductor wafers 102. The cleaning apparatus 100 is again provided with a treatment tank 104 having wafer receivers 106. In a lower, tapering portion of the treatment tank 104, a diffuser 108 is provided that is in communication with a steam generator 110 that is integrated in the treatment tank 104. In a region of the treatment tank 104 disposed laterally beyond the range of movement of the substrates 102 there is provided a heating device 112 for heating the treatment tank 104 and the substrates 102. The treatment tank 104 is again provided with an overflow 114. Disposed in an upper region of the treatment tank 104 is a diffuser 116 for the introduction of ozone, with this diffuser being connected with an ozone generator 118 via a line 117. The diffuser 116 is disposed in a lateral region of the treatment tank 104, and in particular on a side opposite the heating device 112.

Provided above the diffuser 108 is an inlet/outlet opening 120 for rinsing liquid, such as deionized water. The opening 120 is connected in a suitable manner with a source for deionized water. A cover 124 closes off the treatment tank 104 and seals it relative to the atmosphere.

The operation of the apparatus 100 is essentially the same as the apparatus 1 of the first embodiment. The main difference between the apparatus 1 and 100 is in the arrangement of the elements, in particular the integration of the steam generator in the treatment tank 104.

Figure 3:
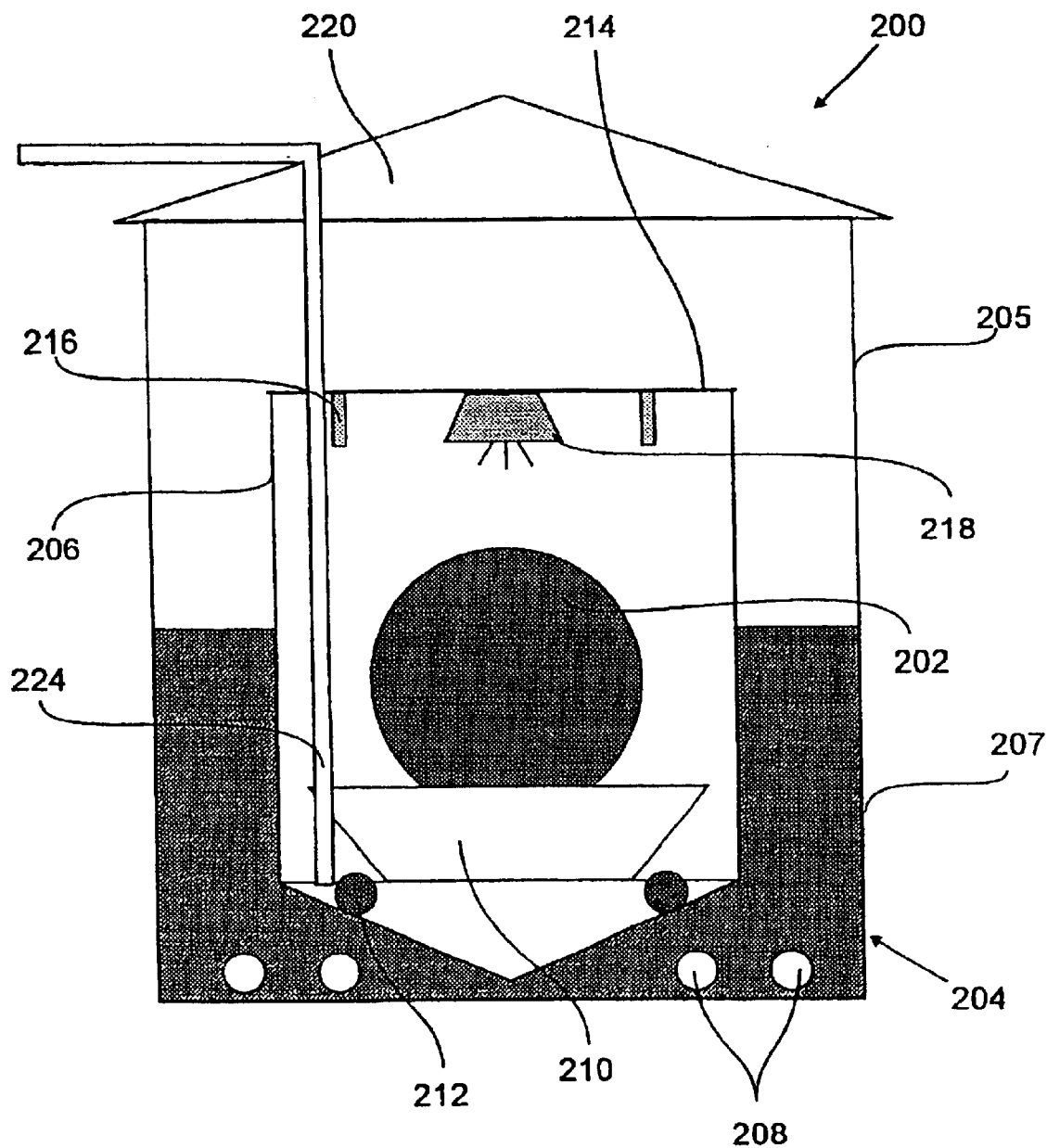
FIG. 3 a schematic illustration of a further embodiment of the invention.

FIG. 3 shows a further embodiment of a cleaning apparatus 200 for semiconductor wafers 202. The cleaning apparatus 200 has a treatment tank 204 that is composed of an outer tank 205 and an inner tank 206. The outer tank 205 is filled at least partially with a liquid 207 that can be heated via a heating device 208. The inner tank 206 is held in a suitable manner within the outer tank in order to prevent floating of the inner tank 206 in the liquid 207.

The inner tank 206 has an upper portion, which has a square or rectangular configuration, and a lower portion, which tapers downwardly to a point. Provided in the treatment tank 206 are non-illustrated holding devices for accommodating the substrates 202. Provided in the tank 206 in the lower region of the rectangular portion, is a pan or trough 210 that is provided with a non-illustrated inlet/outlet opening. Provided beneath the trough is a diffuser 212 for the introduction of a reactive gas, such as ozone, into the treatment tank 206. The diffuser 212 is again an annular diffuser, although it can have any suitable shape that enables a uniform introduction of ozone. Provided in the region of the lower portion that tapers to a point is a non-illustrated fluid inlet/outlet opening.

The treatment tank 206 is closed off by a first, movable cover 214. Provided on the cover 214 is a steam diffuser 216 as well as a liquid spray device 218 that are connected in a suitable manner with a steam source and a liquid source respectively.

To close off the outer and inner treatment tanks a further cover 220 is provided. A withdrawal line 224 extends through the covers 214 and 220 and extends into the inner treatment tank 206. The withdrawal line 224 is connected in a suitable manner with a non-illustrated withdrawal device.

The operation of the apparatus 200 is essentially the same as the operation of the apparatus 1 of the first embodiment.

Figure 4:
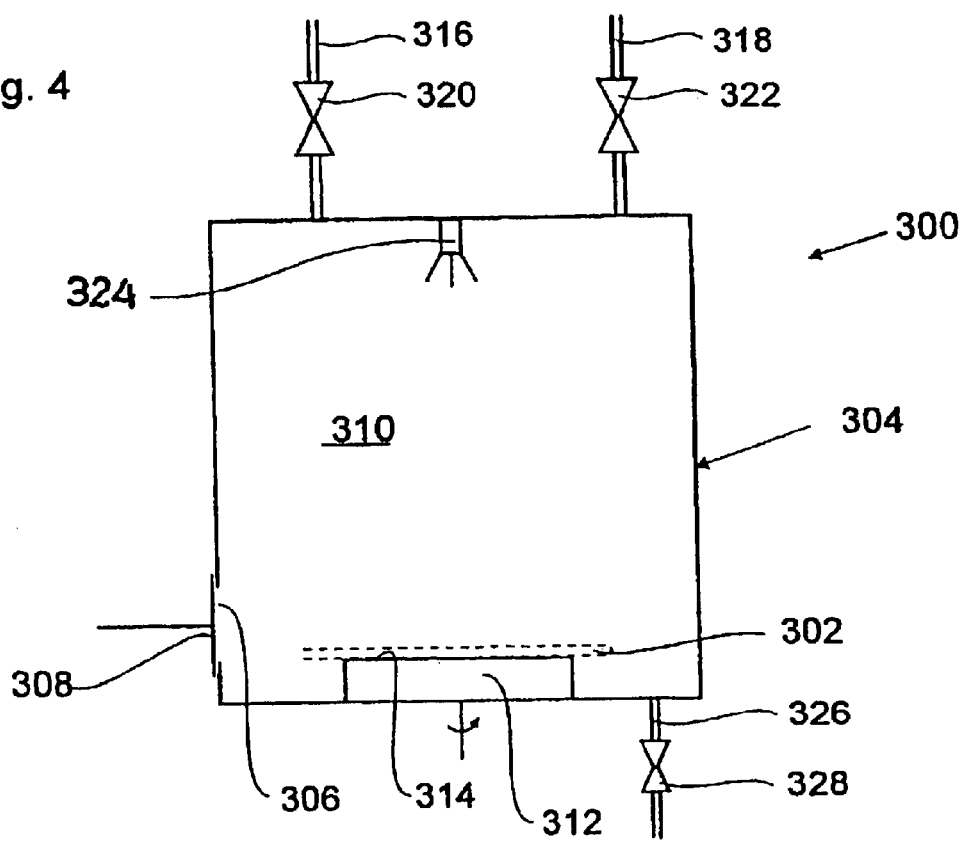
FIG. 4 a schematic illustration of an alternative embodiment of the invention.

FIG. 4 shows a further embodiment of a cleaning apparatus 300 for semiconductor wafers 302. The cleaning apparatus 300 is provided with an essentially closed treatment tank 304 having a square or rectangular cross-sectional configuration. The treatment tank 304 is provided in a lower, lateral region with an inlet/outlet opening 306 that can be closed off by a cover 308. The cover 308 is in a position to seal off an inner chamber 310 of the treatment tank 304 from the atmosphere. Provided in the region of the opening 306 is a non-illustrated pressure-type delivery or transfer mechanism (load lock) via which a semiconductor wafer can be placed in or removed from the treatment tank 304. The transfer mechanism eliminates the necessity for varying the pressure within the treatment tank during feeding and removal. Transfer mechanisms of this type are known and are therefore not described in greater detail.

Provided in the lower region of the treatment tank 304 is a rotatable wafer receiver 312 having a horizontal support surface 314 for the semiconductor wafer 302. To ensure a reliable accommodation of the wafer, the receiver is provided with openings in the support surface 314 to which can be applied a partial pressure in order to firmly draw the semiconductor wafer 302 against the surface.

Lines 316 and 318 having respective control valves 320, 322 are connected with the treatment tank 304. Via the lines 316, 318, pressurized steam and pressurized ozone are introduced into the treatment tank 304. Provided in the upper region of the treatment tank 304 is a rinsing device 324 via which a rinsing liquid, in the form of a finely divided mist, is introduced into the treatment tank 304. Provided at the base of the treatment tank 304 is a discharge line 326 having a control valve 328.

During the operation of the apparatus 300, first a semiconductor wafer 302 is placed into the treatment tank 304 via the opening 306 and is accommodated and fixed upon the receiver 312 and is heated via a non-illustrated heating device in the receiver 312. Subsequently, via the lines 316 and 318, steam and ozone, respectively, under pressure is introduced into the tank 304. In so doing, a certain quantity of steam and ozone are introduced as a function of tank volume, so that a certain overpressure and a certain moisture concentration are achieved in the tank 304. To prevent condensation of steam upon the wafer as well as on the walls of the treatment tank 304, the wafer and tank are heated to a temperature above the steam temperature.

The pressure within the treatment tank 304 is measured and is held at a fixed level. Via the line 326, a portion of the ozone gas/steam mixture formed in the tank 304 is drawn off.

During the above process, the spray device 324 is activated at certain time intervals in order to rinse the substrates. During the rinsing of a wafer, a certain quantity of rinsing liquid is introduced into the treatment tank 4, and after each rinsing process a corresponding quantity of rinsing liquid that corresponds to the introduced quantity is discharged via the line 326. During the above process, the wafer is rotated via the receiver 312 in order to prevent collection of liquid upon the upwardly directed surface of the wafer.

Figure 5:
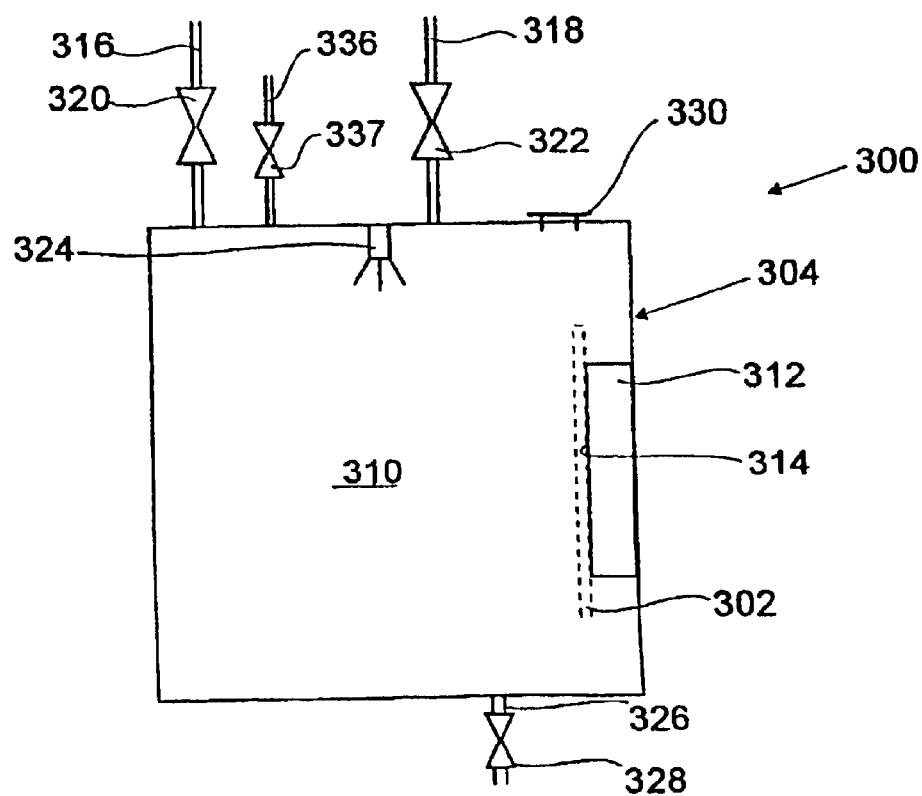
FIG. 5 a schematic illustration of a further embodiment of the invention.

FIG. 5 shows a further embodiment of the inventive apparatus, whereby in FIG. 5 the same reference numerals are used as in FIG. 4 to the extent that the same or equivalent components are in question. The apparatus 300 of FIG. 5 has a treatment tank 304 for the treatment of semiconductor wafers 302. An inlet/outlet transfer means 330 is provided on an upper wall of the treatment tank 304. Provided in an inner chamber 310 of the tank 304 is a wafer receiver 312 having a support surface 314. In contrast to the embodiment of FIG. 4, the wafer receiver 312 is provided on a side wall of the tank 304 and has an essentially vertical support surface 314. The semiconductor wafers 302 are held in a vertical orientation on the receiver 312 via non-illustrated vacuum openings in the support surface 314. Lines 316, 318 having appropriate valves 320, 322 are again provided in an upper region of the treatment tank 304 for the introduction of steam and ozone, respectively; a rinsing device 324 is also provided there. Mounted on the base of the treatment tank 304 is a discharge line 326 having a valve 328.

In addition to the inlet lines 316, 318 for the introduction of steam and ozone, respectively, a further inlet line 336 having a valve 337 is provided. The inlet line 336 serves for the introduction of acetic acid, which promotes the reaction of the ozone gas/steam mixture with the contaminations that are to be removed from the semiconductor wafer 2.

The operation of the apparatus 300 of FIG. 5 is essentially the same as the operation of the apparatus 300 of FIG. 4, whereby for promoting the cleaning effect acetic acid is additionally introduced into the treatment tank 304 during the cleaning. Due to the fact that the semiconductor wafer 302 is disposed in a vertical orientation, a rotation and centrifuging-off of liquid during or after a rinsing process is not necessary, since the liquid readily flows off of the wafer 302.

Figure 6:
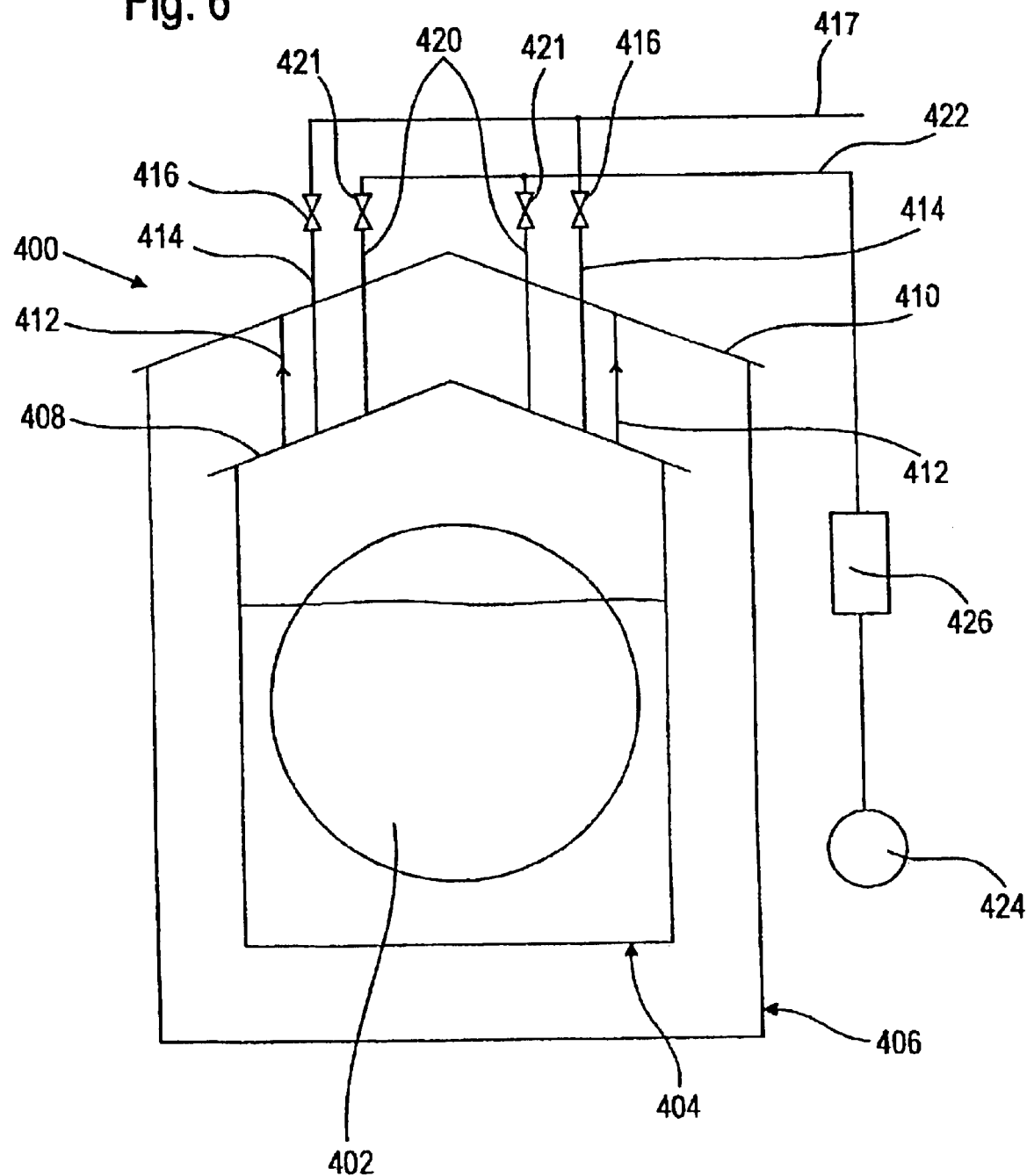
FIG. 6 a schematic illustration of a further embodiment of the invention.

FIG. 6 shows a further embodiment of an inventive apparatus 400 for the cleaning of semiconductor wafers 402. The apparatus 400 has an inner treatment tank 404 that is accommodated and held in an outer treatment tank 406.

The inner treatment tank 404 has a cover 408, whereas the outer treatment tank 406 has a cover 410. The covers 408 and 410 are movable relative to the treatment tanks 404 and 406 in order to provide access to the respective treatment tank. The cover 408 is also movable relative to the cover 410 along suitable guide rails 412 on the cover 410. Alternatively, the covers could also be tiltable relative to one another about appropriate pivot points.

The inner treatment tank 404 can be filled in a controlled manner with ozone gas and steam via non-illustrated inlet lines. Furthermore, the inner treatment tank 404 can be filled with a further gas, such as air or nitrogen, via suitable lines 414 that are mounted on the cover 408. Provided in the lines 414 are respective overpressure valves 416 that open when the pressure in the treatment tank 404 drops below the pressure in the feed line 417. The pressure in the feed line 417 is essentially atmospheric pressure, so that the overpressure valves prevent an underpressure from building up in the treatment tank 404.

The inner treatment tank 404 can furthermore be filled with a liquid, such as deionized water, via a non-illustrated inlet/outlet system, as schematically illustrated in FIG. 6.

Furthermore disposed on the cover 408 are discharge lines 420 in which are disposed respective overpressure valves 421 that open when the pressure in a common discharge line 422 falls below the pressure in the treatment tank 404. The lines 420 are connected with a withdrawal device, such as a pump 424. Disposed between the cover 408 and the pump 424, in the outlet line 420, is an ozone catalyzer 426, such as a manganese oxide catalyzer, in order to convert ozone withdrawn from the treatment tank 404 into oxygen.

During operation of the apparatus 400 of FIG. 6, with the covers 408, 410 open, semiconductor wafers 402 are first loaded into the inner treatment tank 404, where they are accommodated in a non-illustrated holding device. Subsequently, the covers 408 and 410 are closed, whereby the cover 408 essentially sealingly closes off the inner treatment tank 404, while the outer cover 410 does not necessarily have to sealingly close off the outer treatment tank 406. Provided in the outer treatment tank 406 is a non-illustrated withdrawal device that runs continuously in order to draw off gases disposed in the outer treatment tank 406 and in order to prevent gases from escaping into the operating environment from the inner or outer treatment tanks.

The inner treatment tank 404 is filled with hot water in order to bring the wafers 402 to, or at least nearly to, the process temperature. The water is subsequently discharged. The wafers could, of course, be brought to the process temperature in some other manner. The introduction of the water can also be effected prior to closing of the treatment tanks.

After both of the treatment tanks 404, 406 have been closed and the wafers have been brought to the process temperature, first steam is introduced into the inner treatment tank 404 which, as described above, is controlled to a certain moisture concentration. Subsequently, ozone is introduced in the inner treatment tank 404. By means of the pump 424, a certain quantity of the ozone gas/steam mixture that is now found in the treatment tank 404 is drawn off, and is conveyed through the catalyzer 426 in order to convert the ozone in the mixture and thus render it harmless. If by means of the pump 424 more of the ozone gas/steam mixture is withdrawn from the treatment tank than was previously introduced, a slight underpressure results in the treatment tank 404. This underpressure effects an opening of the overpressure valves 416, via which atmospheric air or nitrogen is then introduced into the treatment tank in order to prevent a build up of an underpressure in the treatment tank.

After the ozone gas/steam treatment, the supply of not only steam but also of ozone is halted. The treatment tank 404 is filled with water in order to displace the ozone gas/steam mixture out of the treatment tank 404. In so doing, the ozone gas/steam mixture is withdrawn from the inner treatment tank 404 via the lines 420, 422. After the ozone gas/steam mixture is displaced, first the inner cover 408 is raised, so that the water disposed in the inner treatment tank 404 can overflow into the outer treatment tank 406. From there the water is withdrawn in a suitable manner.

During the opening of the inner cover 408, residual ozone gas that might still be in the inner treatment tank 404 can escape into the outer treatment tank 406, from where it is withdrawn via the continuously running withdrawal system. Only subsequently is the outer cover 410 raised. The water in the treatment tank 404 is withdrawn, and the wafers are dried as described above pursuant to the Marangoni process. The treated wafers 402 are subsequently removed from the treatment tank and new, untreated wafers are introduced.

During the process sequence described above, the quantity of fluid pumped by the pump 424 is adjusted to the respective process conditions. During the ozone gas/steam treatment, essentially that quantity of ozone gas/steam is pumped off by the pump 424 that is introduced via the non-illustrated lines in order to be able to maintain a continuous flow through the treatment tank 404. During the filling of the treatment tank 404 with water, in the same manner the same fluid quantity is pumped off by the pump 424 as is the quantity of water that is introduced into the treatment tank 404 in order to avoid a localized increase in pressure in the treatment tank 404 in the lines 420 or in the common discharge line 422 or in the catalyzer.

Although in the embodiment illustrated in FIG. 6 a feed line 417 having an overpressure valve is provided, via which a gas, such as air or nitrogen, is introduced into the treatment tank in the event that the pressure in the treatment tank falls below the atmospheric pressure, it should be noted that the line is not absolutely necessary. To prevent an underpressure from resulting in the treatment tank 404, the pump 424 can also be controlled in a suitable manner. During the control of the pump volume of the pump, pressure losses in the catalyzer and also the maximum flow volume of the catalyzer must be taken into consideration.

Although this is not specifically addressed in FIG. 6, it is possible to provide in the inner treatment tank 404, for example as with the embodiment of FIG. 3, a rinsing device in order to rinse the semiconductor wafers during the ozone gas/steam treatment. On the whole, it should be noted that the respective elements of the various embodiments can be combined with one another to the extent that this is possible.

The invention was previously explained with the aid of preferred embodiments without being limited to these special embodiments. For example, the cover of the first and second embodiments can also extend over the overflow in order to also cover it and thus seal off the treatment tank relative to the atmosphere. In this case, it would not be necessary to raise the cover during the rinsing with water after the ozone treatment, and the withdrawal device could also be connected with the overflow. Instead of disposing the heating device in the treatment tank, it could also be mounted on the cover. In this case, it could cover a greater region without obstructing the introduction and removal of the substrates. Furthermore, the heating device could be mounted outside of the treatment tank. With the treatment tanks of FIGS. 4 and 5, it would also be possible, prior to the introduction of steam and ozone, to generate an underpressure in order to enable the generation of a plasma for the partial loosening or softening of the contaminations that are to be removed from the wafer.

The specification incorporates by reference the disclosure of German priority documents 199 50 365.6 filed Oct. 19, 1999 and DE 100 07 439.1 filed Feb. 18 2000, and International priority document PCT/EP00/10212 filed 17 Oct. 2000.

The present invention is, of course, in no way restricted to the specific disclosure of the specification and drawings, but also encompasses any modifications within the scope of the appended claims.

What is claimed is:

1. An apparatus for removing organic contamination from substrates, comprising:
    a treatment tank for receiving at least one substrate;
    a cover for closing off said treatment tank;
    a first introduction means for introducing a reactive gas into said treatment tank in a controllable manner;
    a second introduction means for introducing into said treatment tank, in a controllable manner, at least one moisture-containing fluid that promotes a reaction between said reactive gas and a deposit or coating that is to be removed from a substrate;
    a device for measuring and controlling a concentration of moisture in said treatment tank; and
    a controllable withdrawal device.

2. An apparatus according to claim 1, wherein said first introduction means is provided with a valve for controlling a quantity of introduced reactive gas.

3. An apparatus according to claim 1, wherein said first introduction means is provided with an ozone generator.

4. An apparatus according to claim 1, wherein said second introduction means is provided with at least one valve for controlling a quantity of introduced moisture-containing fluid.

5. An apparatus according to claim 1, wherein said second introduction means is provided with a vapor or steam generator.

6. An apparatus according to claim 5, wherein means are provided for controlling at least one of a moisture concentration and a temperature of said vapor.

7. An apparatus according to claim 1, wherein said second introduction means is provided with at least one liquid inlet nozzle.

8. An apparatus according to claim 7, wherein said liquid inlet nozzles are disposed above substrates and are directed against them.

9. An apparatus according to claim 1, wherein a heating device is provided for heating at least one of said treatment tank and contents of said treatment tank.

10. An apparatus according to claim 1, wherein a controllable liquid outlet is provided.

11. An apparatus according to claim 1, wherein a third introduction means is provided for controlling introduction of a further fluid that enhances or accelerates said reaction.

12. An apparatus according to claim 11, wherein said further fluid is a wetting agent or acetic acid.

13. An apparatus according to claim 1, wherein a further gas introduction device is provided for a controllable introduction of a further gas, into said treatment tank.

14. An apparatus according to claim 1, wherein said treatment tank is pressure tight, and wherein a pressure control device is provided.

15. An apparatus according to claim 1, wherein said cover seals off said treatment tank.

16. An apparatus according to claim 1, wherein a further outer tank is provided that surrounds said treatment tank for receiving at least one substrate; and wherein a further cover is provided for closing off said outer tank.

17. An apparatus according to claim 16, wherein said covers of said treatment tanks are movable relative to one another.

18. An apparatus according to claim 16, wherein a withdrawal device is provided for withdrawing gases from said outer treatment tank.

19. An apparatus according to claim 16, wherein means are provided for at least partially filling said outer treatment tank with a heated liquid for heating said inner, first mentioned treatment tank.

\* \* \* \* \*

UNITED STATES PATENT AND TRADEMARK OFFICE
CERTIFICATE OF CORRECTION

PATENT NO. : 6,817,369 B1 Page 1 of 1
APPLICATION NO. : 10/111332
DATED : November 16, 2004
INVENTOR(S) : Wolke et al.

It is certified that error appears in the above-identified patent and that said Letters Patent is hereby corrected as shown below:

<u>Title page,</u>
Item [54] should read as follows:

[54] Title: APPARATUS AND METHOD FOR THE CLEANING OF SUBSTRATES, and same in Col. 1, Lines 1-2

Title Page, Item (73) Assignee should read: [73] Assignee: STEAG Microtech GmbH, Carl-Benz-Strasse 10, D-72124 Pliezhausen, DE Signed and Sealed this Eighth Day of May, 2007

JON W. DUDAS
*Director of the United States Patent and Trademark Office*